United States Patent [19]

Hennig et al.

[11] Patent Number: 4,782,839
[45] Date of Patent: Nov. 8, 1988

[54] METHOD FOR DETERMINING FLOWING MATTER BY MEANS OF NMR TOMOGRAPHY

[75] Inventors: Jürgen Hennig, Freiburg, Fed. Rep. of Germany; Marcel Müri, Rüschlikon, Switzerland

[73] Assignee: Spectrospin AG, Fallanden/Zurich, Switzerland

[21] Appl. No.: 16,299

[22] Filed: Feb. 19, 1987

[30] Foreign Application Priority Data

Feb. 25, 1986 [DE] Fed. Rep. of Germany ....... 3605990

[51] Int. Cl.$^4$ ................................................ A61B 5/05
[52] U.S. Cl. ..................................... 128/653; 324/306; 324/309
[58] Field of Search ................. 128/653, 696; 324/306, 324/309

[56] References Cited

U.S. PATENT DOCUMENTS

| | | | |
|---|---|---|---|
| 4,021,726 | 5/1977 | Garroway et al. | 324/309 |
| 4,532,473 | 7/1985 | Wehrli | 128/653 |
| 4,565,968 | 1/1986 | Macovski | 324/309 |
| 4,574,239 | 3/1986 | Singer | 128/653 |

OTHER PUBLICATIONS

Leon Kaufman, PhD et al, Investigative Radiology: Evaluation of NMR Imaging for Detection and Quantification of Obstructions in Vessels, No. 17, 1982, pp. 554–560.

Science, vol. 221: Nuclear Magnetic Resonance Blood Flow Measurements in the Human Brain, pp. 654–656 1983.

Biomedizinische Technik, vol. 30, No. 1-2/1985, K. Barth et al: Visualization and Measurement of Flow with Magnetic Resonance Imaging, pp. 12–17.

*Primary Examiner*—Ruth S. Smith
*Attorney, Agent, or Firm*—Pennie & Edmonds

[57] ABSTRACT

NMR tomography permits identification of flowing matter within a closed body, as there is a reduction in signal intensity as a consequence of a saturation of the magnetization in the area of a slice that has been excited for imaging, while freshly inflowing matter has not experienced this saturation and consequently provides a stronger signal. Special excitation sequences permit either virtually complete saturation of stationary tissue, and thus particularly strong emphasis of flowing matter, or excitation of stationary and flowing matter in different zones and with differing intensities, thereby enabling very precise quantitative and even directional flow measurements to be performed.

6 Claims, 4 Drawing Sheets

METHOD FOR DETERMINING FLOWING MATTER BY MEANS OF NMR TOMOGRAPHY

The present invention relates to a method for determining flowing matter within a self-contained body by means of NMR tomography, in which said body is subjected to selected magnetic fields and the spins which are present in the area of a cross-sectional plane of said body that is defined by a slice gradient are excited by sequences of excitation pulses, whose spacing is shorter than the spin-lattice relaxation time, thereby producing at least a partial saturation of the magnetization during the scanning period, which saturation in turn reduces the intensity of the resonance signals, and in which said resonance signals are processed in such a manner as to produce an image of said cross-sectional plane of said body in which those locations in which matter is present which has flowed into said cross-sectional plane from outside and is therefore less saturated are emphasized relative to their surroundings through their greater brightness as a result of the greater intensity of said resonance signals.

A method of this type is known from "Investigative Radiology", No. 17, 1982, pages 554 through 560. The known method is intended primarily to identify clogged blood vessels in the human body. While healthy blood vessels can be identified by the high signal intensity that they produce as a result of the flow of blood therein, clogging causes a decline in the flow velocity and/or constriction of the vessel, which can be identified by means of the correspondingly darker areas.

Moreover, determination of the flow velocity of blood in the human body through observation of the time that is required to achieve the maximum intensity after excitation, i.e. for complete substitution of the blood in the observed zone, is known from "Science", No. 221, 1983, pages 654 through 656.

The optimum application of a method of this nature for various tasks necessitates optimization of various parameters. If the intent is to identify very narrow blood vessels and/or blood vessels with low flow rates, it is important to produce the greatest possible contrast. On the other hand, the most precise possible determination of the volume of liquid that flows through a vessel during a given unit of time, and not optimum contrast, is the important aspect in identifying flow velocity. Moreover, it is also necessary to identify the direction of flow of the matter.

It is therefore the object of the present invention to further develop a method of the type described at the outset in such a manner as to permit any of the various requirements to be satisfied, as may be needed in the individual instance.

According to the present invention., this object is solved in that between successive RF excitation pulses a further slice gradient is applied =nd said body is irradiated with at least one additional RF saturation pulse, the time intervals between said RF excitation pulses and said RF saturation pulses and/or the flip angles that are produced by said pulses, being appropriately selected to produce a stationary state of minimal magnetization in at least one zone defined by said slice gradients.

The employment of additional RF saturation pulses in conjunction with a slice gradient of their own permits differing operating states to be produced through selection of the chronological intervals, the flip angles, as well as the location of the excitation, with these various operating states being able to be optimized for the individual applications. Thus, in particular, it is possible to bring those zones which are excited by the RF excitation pulses and those which are excited by the RF saturation pulses into coincidence so as to produce minimum magnetization in the entire excited zone, as a result of which the body's stationary matter supplies virtually no further signal, thus permitting even very minute portions of flowing matter to be properly identified.

However it is also possible for the zone that is excited by the RF saturation pulses to have a greater extent perpendicular to the cross-sectional plane of the body than the zone that is covered by the RF excitation pulses, so that the zone which is excited by the RF saturation pulses includes the zone which is excited by the RF excitation pulses. In this case, too, it is again possible to produce virtually complete suppression of the signal of the stationary matter and, in particular, of the stationary body tissue, in the zone that is covered by the RF excitation pulses, while only partial saturation is produced in zones adjacent thereto. Setting the thickness of these zones permits volume elements to be marked and thus highly precise measurement of the flow velocity. If, in addition, it is ensured that a border of the zone which is excited by the RF excitation pulses is in coincidence with a border of the zone which is excited by the RF saturation pulses, the directional flow can also be identified, as matter that is still completely undisturbed will enter the observation zone that is defined by the RF excitation pulses from the one side, while matter that has been partially saturated by means of the RF saturation pulses will enter this zone from the other.

When the method according to the present invention is employed, it is preferable to utilize sequences in which the slice gradient that is activated for the duration of the RF excitation pulse is reversed at the end of each RF excitation pulse in order to rephase the excited spins. Moreover, a read gradient and, possibly, a phase gradient is activated after every RF excitation pulse for the duration of the reversal of the slice gradient. The read gradient is then reversed in order to produce a spin echo signal, with one RF saturation pulse being irradiated between every two successive RF excitation pulses. As already recited above, a slice gradient will then again be present, which, however, need not be the same as the slice gradient that was activated for the duration of the RF excitation pulses.

The above discussed and other objects, features and advantages of the present invention will become more apparent from the following description thereof, when taken in connection with the practical examples shown in the accompanying drawings, in which FIG. 1 shows the diagram of an excitation sequence for implementation of the method according to the present invention;

Figure 1:
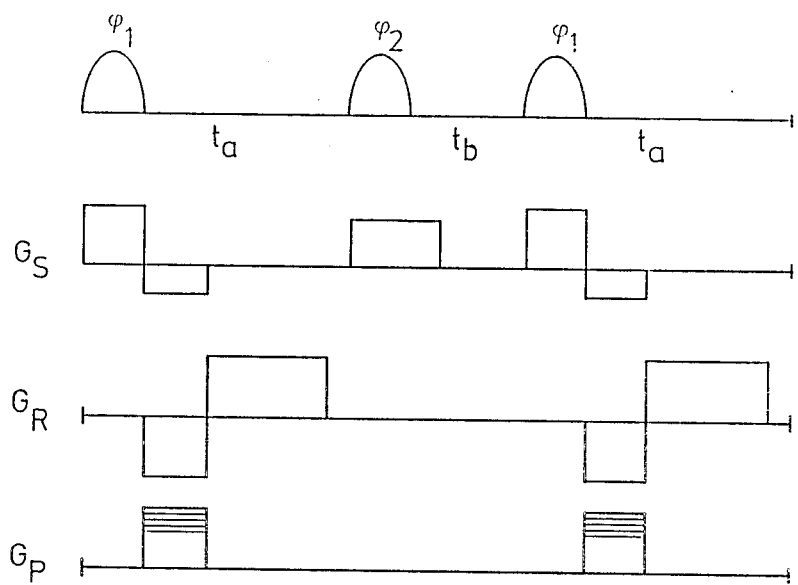

Referring now to the drawings, where like reference numerals designate like parts throughout the several views, it will be seen that, in the case of the excitation sequence that is illustrated in FIG. 1, the specimen is first excited by means of an RF excitation pulse $\phi_1$ in the presence of a slice gradient $G_S$. Following the end of the RF excitation pulse, the dephasing of the magnetization that occurred under the slice gradient is corrected through inversion of slice gradient $G_S$. During inverted slice gradient $G_S$, the specimen is subjected to an inverted read gradient $G_R$, whose reversal at the end of slice gradient $G_S$ causes a spin echo signal to be produced. The variation of the echo signal that is obtained under read gradient $G_R$, which is required for image generation, is achieved through the employment of a phase gradient $G_P$, which differs from scanning cycle to scanning cycle and which is applied whenever slice gradient $G_S$ and read gradient $G_R$ are inverted. Following a period of time $t_a$, the spin system is then subjected to an RF saturation pulse $\phi_2$, with the specimen also being subjected to a slice gradient $G_S$ for the duration thereof, although slice gradient $G_S$ need not necessarily coincide with the slice gradient that exists during RF excitation pulse $\phi_1$. Following a further waiting period $t_b$, during which a gradient is applied in order to destroy the transversal magnetization coherence that was generated by RF saturation pulse $\phi_2$, the sequence is repeated. This gradient can simply be the slice gradient for RF saturation pulse $\phi_2$. After this sequence has been repeated only a few times, the system attains a stationary state, in which the magnetization in the excited zone is at a minimum.

In the case of a single excitation, the following will apply for the chronological curve of z-magnetization M, which has a value of $M_a$ at time t=0 and whose equilibrium value is equal to $M_O$:

$$M = M_a \exp(-t/T_1) + M_0[1 - \exp(-t/T_1)] \quad (1)$$

Moreover, the following will apply if z-magnetization $M_a$ is rotated about flip angle $\Psi$ by means of an RF pulse:

$$M_p = M_a \times \cos\Psi \quad (2)$$

If the sequence that has been explained on the basis of FIG. 1 is employed repeatedly, one time after another, the following value will be obtained for stationary state magnetization $M_{SS}$ directly prior to RF excitation pulse $\phi_1$:

$$M_{SS} = \frac{M_0[1 - \exp(-t_a/T_1)] \times \cos\beta \times \exp(-t_b/T_1) + M_0[1 - \exp(-t_b/T_1)]}{1 - \cos\alpha\cos\beta\exp[-(t_a + t_b)/T_1]} \quad (3)$$

In this equation, $\alpha$ is the flip angle of RF excitation pulse $\phi_1$, while $\beta$ is the flip angle of RF saturation pulse $\phi_2$.

Maximum signal suppression is achieved when $M_{SS}$ is as small as possible. Several special cases will now be investigated in which $M_{SS}$ assumes a low value, i.e. the residual magnetization is, as is desired, of only small magnitude.

If RF excitation pulse $\phi_1$ and RF saturation pulse $\phi_2$ are selected in such a manner that their flip angles $\alpha = 90°$ and $\beta = 180°$, respectively, $\cos \alpha = 0$ and $\cos \beta = -1$. If these values are employed in equation (3), the following is obtained:

$$M_{SS} = M_0\{1 - 2\exp(-t_b/T_1) + \exp[-(t_a+t_b)/T_1]\} \quad (4)$$

Figure 2:
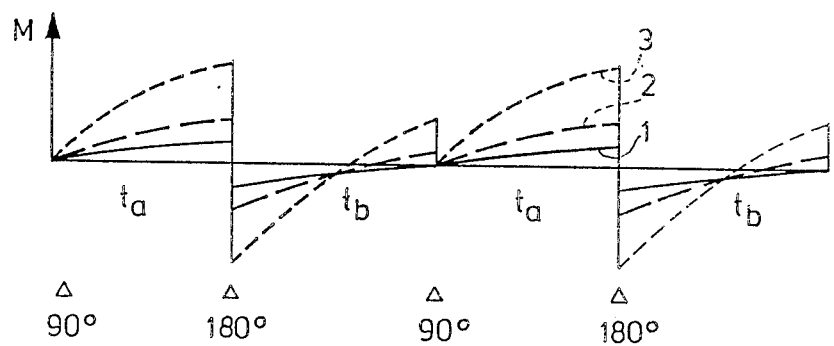
FIG. 2 shows a diagram of the saturation states that are able to be achieved if the excitation sequence according to FIG. 1 is employed.

For a substance having a long spin-lattice relaxation time $T_1$, it will be found that $M_{SS}=0$ when $t_a=t_b$ to the first approximation. The magnetization curve for long relaxation times $T_1$ is shown by curve 1 in FIG. 2. As shown by curves 2 and 3, $M_{SS}$ will still vary considerably from zero for medium-length and short relaxation times $T_1$.

Human body tissue has areas that display greatly differing relaxation times $T_1$. In this case, it is therefore not always the most advantageous approach to make $t_a$ and $t_b$ identical in order to suppress z-magnetization, i.e. to locate RF selection pulse $\phi_2$ exactly midway between two successive RF excitation pulses $\phi_1$. On the contrary, it is then practical to set $t_a$ and $t_b$ to a minimum stationary signal.

Another possibility is to set the stationary state magnetization by adjusting the flip angle with given pulse intervals $t_a$ and $t_b$. If, for example, flip angle $\alpha$ of RF excitation pulse $\phi_1$ is set to 90°, it is possible to calculate that flip angle $\beta$ of the RF saturation pulse for which $M_{SS}=0$. From equation (3):

$$\cos\beta = \frac{\exp(-t_b/T_1) - 1}{[1 - \exp(t_a/T_1)]\exp(-t_b/T_1)} \quad (5)$$

Here, too, flip angle $\beta$ for complete signal suppression depends upon relaxation time $T_1$, which is not, however, uniform for the entire specimen; consequently, through trial and error, it is necessary to find the value of $\beta$ at which maximum signal suppression is achieved with given $t_a$ and $t_b$.

Figure 3:
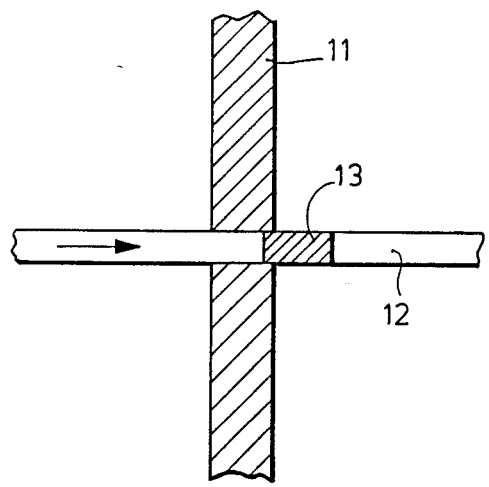
FIG. 3 shows a schematic cross section taken through excited portions of tissue, with a first embodiment of the method according to the present invention being employed.

Until now, it had been assumed that, in a sequence according to FIG. 1, the RF excitation pulses and RF saturation pulses were selected, in conjunction with the corresponding slice gradients, in such a manner that precisely the same slice of the body was scanned by both. The above-described adjustment of $t_a$ and $t_b$, and thus $\beta$, causes the stationary matter that is located in the area of the excited cross-sectional plane to supply only a very insignificant portion of the signal. FIG. 3 shows the state in which a slice 11 has been excited in the abovedescribed manner in such a way as to produce minimum magnetization, which means that the stationary matter supplies virtually no signal whatever. Slice 11 is penetrated by a vessel 12 containing a flowing liquid, such as blood, for example. The volume element 13, which was initially located in the area of slice 11, is carried out of the area of slice 11 by the flow in vessel 12 and is replaced by liquid which had not been subjected to the saturation process. Consequently, this liquid provides a strong signal, thereby permitting vessel 12 to be identified with great clarity in a cross-sectional image which reproduces slice 11 of the body.

Figure 4:
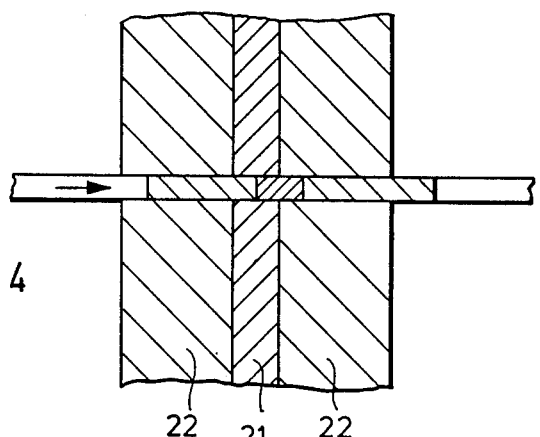
FIG. 4 shows a schematic cross section taken through excited portions of tissue, with a second embodiment of the method according to the present invention being employed.

Through appropriate selection of the frequency of RF saturation pulse $\phi_2$ and the strength of slice gradient $G_S$, it is possible to design the zones that are scanned by the RF excitation pulse,. differently than those that are scanned by the RF saturation pulse. In the case which is illustrated in FIG. 4, RF excitation pulse $\phi_1$ excites the spins in the area of a very thin slice 21, while RF saturation pulse $\phi_2$ acts in the area of a much thicker slice 22. Slice 21, which was excited by the excitation pulse, is arranged centrally relative to thicker slice 22. The resonance signals that are employed for imaging purposes always come from slice 21, which is excited by means of RF excitation pulse $\phi_1$.

In this case, the following is obtained for a stationary magnetization state:

$$M_{SS}=M_0[1-\exp(-(t_a+t_b))]/[1-\cos\beta\exp(-(t_a+t_b)/T_1)] \quad (6)$$

Figure 5:
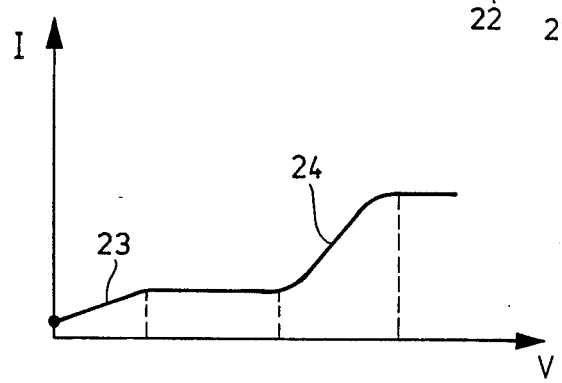
FIG. 5 shows a chronological diagram of the signal intensities that are able to be achieved with excitation according to FIG. 4.

In this case, stationary state magnetization $M_{SS}$ will be very small relative to the equilibrium value $M_0$ of the magnetization, i.e. the stationary state magnetization will tend toward 0 when $t_a+t_b$ is small relative to $T_1$. In this case, it will not be the stationary tissue in the area of slice 21 that is represented by weakened signals, but all of the matter that is located in thicker slice 22. Consequently, the matter that is flowing toward central slice 21 will also initially have a weaker signal, until the matter that is located outside of slice 22 reaches central slice 21. By varying the thickness of slice 22, this will permit quantitative determination to be made of the flow velocity. FIG. 5 illustrates how the signal strength I initially increases when matter flows from slice 22 to the area of slice 21 (portion 23 of the curve). The somewhat stronger signal continues for as long as matter from slice 22 is located in slice 21. When matter from outside of slice 22 then reaches slice 21, there is a very strong signal increase in portion 24 of the curve according to FIG. 5, until the signal remains constant when only matter that originated outside of slice 22 is located in slice 21.

Figure 6:
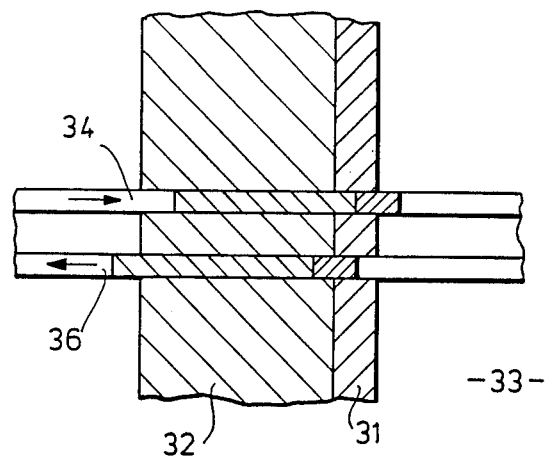
FIG. 6 shows a representation similar to FIG. 4 for a third embodiment of the method according to the present invention.
Figure 7:
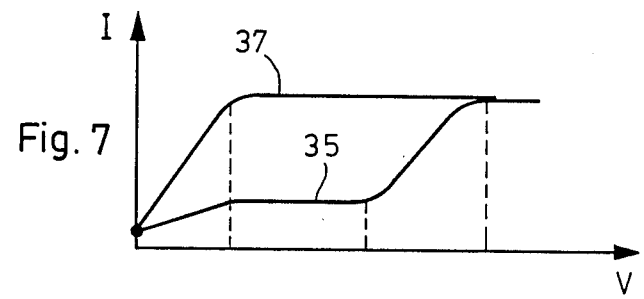
FIG. 7 shows a diagram of the chronological curve of the signal intensities with excitation according to FIG. 6.

FIG. 6 illustrates an alternative in which a volume 32 which was identified by means of RF saturation pulse $\phi_2$ is not arranged concentrically relative to a volume 31, which was identified by RF excitation pulse $\phi_1$, but in such a manner in that, while each of the two volumes is covered one by the other, volume 32 protrudes over volume 31 on one side only. In this manner, greatly differing signals are created, depending upon whether new matter flows into slice 31 from a zone 33, which was not excited at all, or from thicker slice 32. The shape of the signal curve of that portion of an upper vessel 34 which flows in from slice 32 is identical to the shape of the curve of the signal according to FIG. 5 and is shown in FIG. 7 by curve 35. As shown by curve 37 in FIG. 7, on the other hand, there is an immediate, steep increase in the signal strength I for volumes which flow into slice 31 from excitation-free zone 33, as is the case in a lower vessel 36 in FIG. 6.

Figure 8:
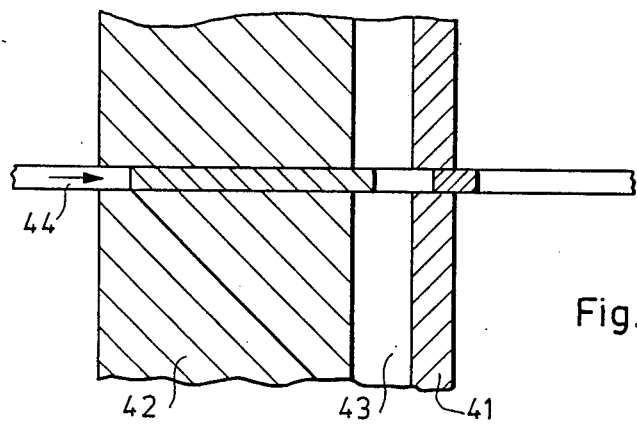
FIG. 8 shows a representation similar to FIG. 4 for a fourth embodiment of the method according to the present invention.

And, finally, the case will now also be studied in which the two zones 41, 42 which are excited by means of RF excitation pulse $\phi_1$ and by means of RF saturation pulse $\phi_2$ are completely isolated one from the other, i.e. in which a non-excited slice 43 is located therebetween, as illustrated in FIG. 8.

Figure 9:
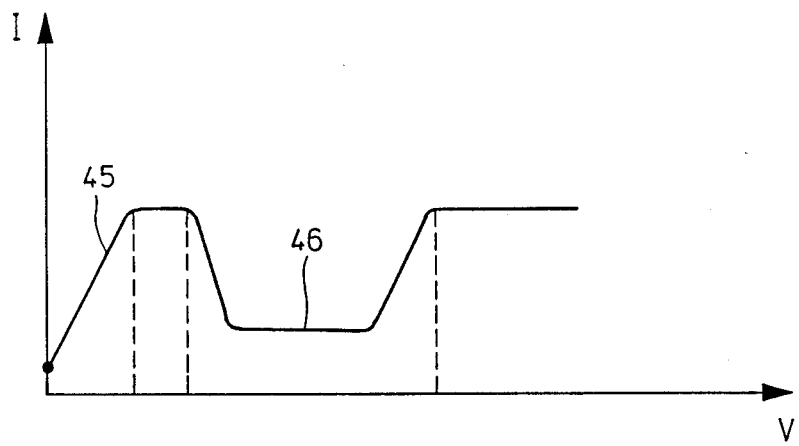
FIG. 9 shows a diagram of the chronological curve of the signal intensities with excitation according to FIG. 8.

Again, the shape of the signal curve is represented by the curve that is shown in FIG. 9. The increase 45 of signal strength I represents the inflow of matter from a non-excited slice 43 into the area of an excited slice 41. The matter from a less strongly excited slice 42 then reaches slice 41, thus producing a decline in the signal, following by an increase again, as represented by the trapezoidal-shaped portion of the curve 46, which commences when, once again, as-yet unexcited matter from the other side of slice 42 reaches slice 41.

Figure 10:
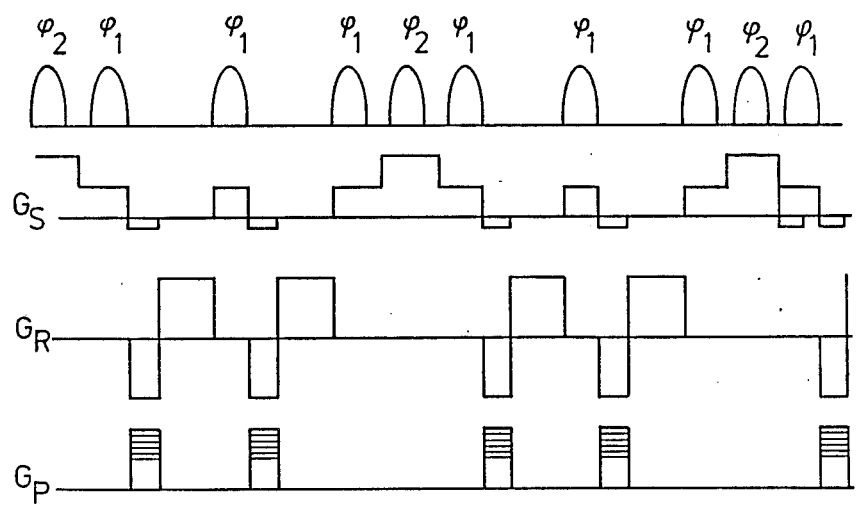
FIG. 10 shows the diagram of a further excitation sequence for implementation of the method according to the present invention.

FIG. 10 shows a version of an excitation sequence in which an RF saturation pulse $\phi_2$ is not provided between all successive RF excitation pulses $\phi_1$, but only after every third RF excitation pulse $\phi_1$. And RF excitation pulses $\phi_1$ come in such close succession that each follows directly behind the read phase that follows the preceding RF excitation pulse. Consequently, it is necessary for this read phase to be eliminated when an RF saturation pulse $\phi_2$ is interposed, as shown in FIG. 10. Here, too, RF pulses $\phi_1$ and $\phi_2$ can have different carrier frequencies, so that, in conjunction with slice gradients $G_S$ that are of differing height and slope, they can excite slices of differing location and thickness.

And, finally, mention should also be made of the fact that, in medical practice, it is readily possible to couple measurements of flowing substances that are performed pursuant to the method according to the present invention with observation of the heartbeat by having the NMR measurements synchronized by an EKG that is being performed. It is possible to derive gate signals from a patient's EKG which permit a plurality of echo signals having identical phase coding to be read out. At the next trigger, it is then again possible to read out a plurality of mutually identical signals which do, however, differ from the previously coded signals, as is necessary in order to produce EKG-synchronous flow images.

The present invention has been described above on the basis of preferred practical examples thereof. Obviously, many modifications and variations of the present invention are possible in the light of the above teachings. It should therefore be understood that, within the scope of the appended claims, the present invention may be practiced otherwise than as specifically described. In particular, individual characteristics of the invention can be employed individually or in combination one with the other.

What is claimed is:

1. A method for determining flowing matter within a self-contained body by means of NMR tomography, in which said body consists of molecules including spins and is subjected to selected magnetic fields and the spins which are present in the area of a cross-sectional plane of said body that is defined by a slice gradient are excited during a scanning period by sequences of RF excitation pulses, whose spacing is shorter than a spin-lattice relaxation time of a majority of spins included in said body, thereby producing at least a partial saturation of the magnetization produced by spins present in said area during the scanning period, which saturation in turn reduces the intensity of resonance signals induced by said magnetization, and in which said resonance signals are processed in such a manner as to produce an image of said cross-sectional plane of said body in which those locations in which matter is present which has flowed into said cross-sectional plane from outside and is therefore less saturated are emphasized relative to their surroundings through their greater brightness as a result of the greater intensity of said resonance signals, wherein between successive RF excitation pulses a further slice gradient is applied and said body is irradiated with at least one additional RF saturation pulse, at least one of the values comprised of the time intervals between said RF excitation pulses and said RF saturation pulses and of flip angles that are produced by said pulses, being appropriately selected to produce a stationary state of minimal magnetization in at least one zone defined by said slice gradients.

2. The method according to claim 1, wherein said zones which are excited by said RF excitation pulses and by said RF saturation pulses are generally identical.

3. The method according to claim 1, wherein said zone that is excited by said RF saturation pulses includes said zone that is excited by said RF excitation pulses.

4. The method according to claim 3, wherein a border of said zone that is excited by said RF excitation pulses is in coincidence with a border of said zone that is excited by said RF saturation pulses.

5. The method according to claim 1, wherein the slice gradient that is activated for the duration of said RF excitation pulse is reversed at the end of each RF excitation pulse in order to rephase the excited spins, wherein a read gradient is activated after every RF excitation pulse for the duration of said reversal of said slice gradient, wherein said read gradient is then reversed in order to produce a spin echo signal, and wherein one RF saturation pulse is irradiated between every two successive RF excitation pulses.

6. The method according to claim 1, wherein sequences of excitation pulses are initiated in synchronism with an electrocardiograph for the purpose of measuring the flow of blood in the human body.

* * * * *